United States Patent [19]

Cornish et al.

[11] Patent Number: 4,533,886
[45] Date of Patent: Aug. 6, 1985

[54] SELF-BIASING BROADBAND FREQUENCY DIVIDER

[75] Inventors: William D. Cornish, Nepean; Lawrence B. Hewitt, Calgary, both of Canada

[73] Assignee: Minister of National Defence, Canada

[21] Appl. No.: 452,505

[22] Filed: Dec. 23, 1982

[30] Foreign Application Priority Data

May 14, 1982 [CA] Canada ................................. 403007

[51] Int. Cl.³ .............................................. H01P 1/20
[52] U.S. Cl. .................................... 333/218; 307/320; 333/247
[58] Field of Search .................... 333/205, 218, 247; 307/320; 363/158; 455/327; 331/107 SL

[56] References Cited

U.S. PATENT DOCUMENTS 4,152,680  5/1979  Harrison ............................. 333/218
4,251,817  2/1981  Kimura et al. ................. 333/247 X Primary Examiner—Paul Gensler
Attorney, Agent, or Firm—Larson and Taylor

[57] ABSTRACT

A microwave frequency divider operable in 2–16 GHZ range over octave bandwidths. A circuit resonant at a subharmonic frequency is formed by a pair of input microstrip transmission lines coupled to a pair of output microstrip transmission lines. Each input line is terminated by a varactor diode. The input signal is supplied to the resonant circuit by a pair of microstrip lines functioning as a two stage quarter wave transformer. A pair of slots are formed in the ground plane underneath the resonant circuit. The electric field distortion thereby produced serves to bias the varactors into forward conduction for efficient subharmonic generation.

4 Claims, 2 Drawing Figures

SELF-BIASING BROADBAND FREQUENCY DIVIDER

This invention relates to broadband frequency dividers operable in the 2-16 GHZ range over octave bandwidths.

Such frequency dividers are described in applicant's U.S. Pat. No. 4,152,680, issued May 1, 1979, naming Robert C. Harrison as inventor and U.S. Pat. No. 4,334,202, issued June 8, 1982, naming William D. Cornish and Francois A. Gauthier as inventors. In U.S. Pat. No. 4,152,680, a frequency divider is described using varactor diodes. A pair of input microstrip transmission lines and a pair of output microstrip transmission lines are arranged to form a circuit resonant at the subharmonic frequency, each input line being terminated by a varactor diode. A microstrip line supplies a signal to the resonant circuit and a coplanar waveguide balun transmits the frequency divided output signal. U.S. Pat. No. 4,334,202 describes improvements in the manner of bias voltage supply to such frequency dividers.

Such known frequency dividers require a DC bias voltage to drive the varactor diodes into forward conduction and the bias voltage must be maintained to ±0.05 volts about a nominal voltage between 0.1 and 1.0 volts (Typical values are 0.6 to 0.8 volts). Small variations in the bias voltage significantly change the characteristics of the frequency divider. In addition, the DC bias network which has been used interferes with the rf circuit and typically causes spurious oscillations to be developed in the frequency divider.

It is therefore the object of this present invention to provide an improved frequency divider which does not require the injection of a DC bias voltage while retaining octave or near-octave bandwidths, and which circumvents the problems of spurious signal generation caused by the biasing network.

It is a further object of this invention to provide a highly stable frequency divider which is not dependent on an accurate and highly stable DC voltage source.

It is a further object of this invention to provide a frequency divider that does not require electrical isolation (at DC) on the input and output, thus providing for a lower cost device and more flexibility in the design and physical lay-out of the circuit.

Specifically, the present invention is used in a microstrip transmission line frequency divider having a circuit resonant at a sub-harmonic frequency with a pair of input lines coupled to a pair of output lines, each input line terminating in a varactor diode connected between it and the ground plane. The invention relates to the improvement comprising the ground plane defining a pair of slots located at the resonant circuit, each slot being separated from the other and generally located underneath one input line and its associated output line, adjacent a varactor and extending laterally outwardly, whereby the varactors are biased into forward conduction.

A particular embodiment of the invention will now be described with reference to the accompanying drawings in which.

DESCRIPTION OF THE PREFERRED EMBODIMENT

Figure 1:
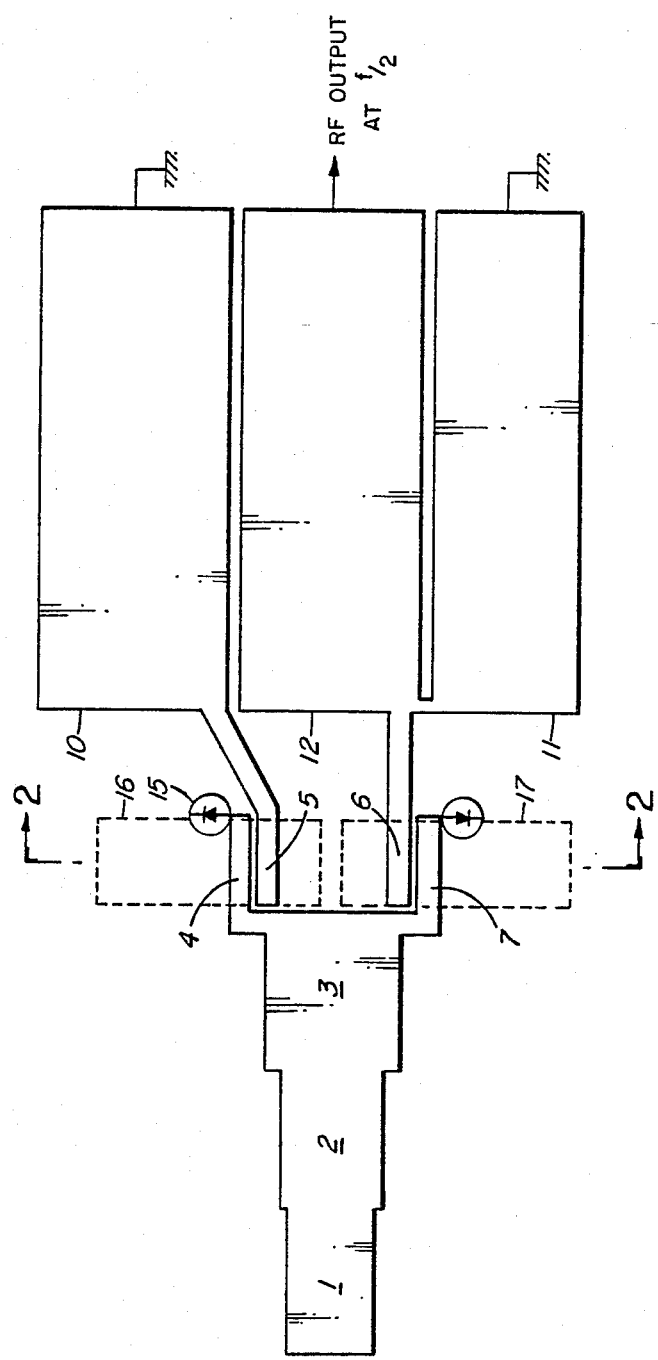
FIG. 1 is a plan view of a frequency divider according to this invention.

FIG. 1 shows a plan view of the frequency divider. The portion to the left of elements 10 and 11 is formed as a microstrip line, that is, there is a ground plane separated from the conductors shown by a substrate. Elements 10, 11 and 12 are formed as coplanar wave guides, that is, there is no ground plane beneath these conducting members.

Line 1 is the input line designed to have a 50Ω impedance. Lines 2 and 3 provide impedance matching between the impedance of line 1 and the resonant circuit which is comprised of lines 4, 5, 6 and 7 and the two varactor diodes 15 and 16.

The resonant circuit is designed to support oscillations at one-half the input frequency. The method is substantially that taught in U.S. Pat. No. 4,152,680. Lines 10, 11 and 12 comprise a balun for transforming the balanced output signals which appear on lines 5 and 6 to the unbalanced coaxial output at the right end of line 12. It has been found that making the grounded lines 10 and 11 very wide in relation to line 12, results in better performance.

In this type of frequency divider broadband performance is only achieved when the varactor diodes are in a state of forward conduction. Hence, known designs incorporate a bias circuit to apply a DC voltage to drive the diodes into forward conduction. This necessitates the use of DC blocking capacitors to isolate the diodes electrically.

In the present invention, it has been found that the incorporation of slots in the ground plane beneath the resonator section removes the necessity for an external bias voltage and the necessity for elements to electrically isolate the diodes from the input and output ports. It appears that the inclusion of the slots alters the electric field, in the vicinity of the diodes, in a manner that causes them to be "self-biased" into forward conduction.

Figure 2:
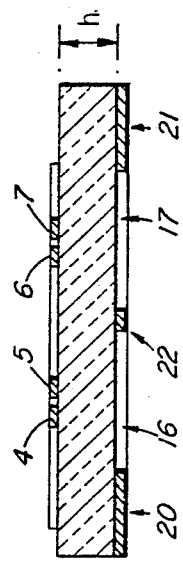
FIG. 2 is a cross sectional view of the resonant circuit section of the frequency divider drawn to a reduced scale.

The slots are shown in dotted outline at 16 and 17 in FIG. 1 and in side view in FIG. 2. The material of the ground plane on either side of the slots is indicated at 20 and 21 with the narrow strap remaining between the slots indicated at 22. It has been found that strap 22 is necessary for proper operation of the device. The length of the slots 16 and 17 in the laterally outward direction beyond lines 4 and 7 is not critical except that it is necessary that each should extend for a distance at least equal to the thickness h of the dielectric substrate.

A typical construction of such a frequency divider is on RT/Duroid 6010 with a dielectric constant of 10.5. The dielectric is 0.075 inches thick (dimension h in FIG. 2) and clad with 0.014 in copper on both sides. The varactor diodes used are Microwave Associates Model MA-48501-E.

It has been found that this divider will divide signals from about 4.2 to 8 GHz and be free of spurious signals over the entire band.

For comparative purposes, a divider with no slots cut in the ground plane was tested operating at zero DC bias and it was found that the bandwidth was much more limited. This device can be made to operate over the entire band if an appropriate DC bias voltage is applied.

In previously known devices the DC bias lines affected the RF performance. Spurious responses occurred due to the presence of bias lines which it was possible to remove with careful tuning of the bias circuit, however, adding additional complexity to the design and construction processes.

Thus, there has been described a frequency divider of simplified construction free from such spurious responses.

The embodiments of the invention in which an exclusive property or privilege is claimed are defined as follows:

1. In a microstrip transmission line frequency divider having a circuit resonant at a sub-harmonic frequency with a pair of input lines coupled to a pair of output lines, each input line terminating in a varactor diode connected between it and the ground plane, the improvement comprising the ground plane defining a pair of slots located at the resonant circuit, each slot being separated from the other and generally located underneath one input line and its associated output line, adjacent a varactor and extending laterally outwardly, whereby the varactors are biased into forward conduction.

2. A circuit as set out in claim 1 wherein each slot extends laterally outwardly beyond the resonant circuit for a distance at least equal to the thickness of the transmission line.

3. A circuit as set out in claim 1 further including a coplanar waveguide balun connected to said output lines.

4. A circuit as set out in claim 1 wherein the portion of the ground plane between said slots extends longitudinally and centrally of the resonant circuit.

* * * * *